United States Patent
Casebolt

(10) Patent No.: US 7,286,345 B2
(45) Date of Patent: Oct. 23, 2007

(54) RACK-MOUNTED AIR DEFLECTOR

(75) Inventor: Matthew P. Casebolt, Fremont, CA (US)

(73) Assignee: Rackable Systems, Inc., Milpitas, CA (US)

( * ) Notice: Subject to any disclaimer, the term of this patent is extended or adjusted under 35 U.S.C. 154(b) by 237 days.

(21) Appl. No.: 11/054,031

(22) Filed: Feb. 8, 2005

(65) Prior Publication Data
US 2006/0176664 A1    Aug. 10, 2006

(51) Int. Cl.
G06F 1/20      (2006.01)
(52) U.S. Cl. .................................... 361/687
(58) Field of Classification Search ................. 361/687
See application file for complete search history.

(56) References Cited
U.S. PATENT DOCUMENTS 4,774,631 A  *  9/1988  Okuyama et al. ........... 361/695
6,496,366 B1     12/2002  Coglitore et al.
6,867,967 B2 *  3/2005  Mok ........................... 361/687
6,927,980 B2 *  8/2005  Fukuda et al. .............. 361/687
2003/0198018 A1* 10/2003  Cipolla et al. .............. 361/687
2004/0114323 A1  6/2004  Mok
2005/0168945 A1*  8/2005  Coglitore ..................... 165/121

OTHER PUBLICATIONS

International Search Report, PCT/US06/03948, mailing date May 7, 2007.
Written Opinion of the International Searching Authority, PCT/US06/03948.

* cited by examiner

*Primary Examiner*—Lisa Lea-Edmonds
(74) *Attorney, Agent, or Firm*—MacPherson Kwok Chen & Heid LLP; Hugh H. Matsubayashi

(57) ABSTRACT

One or more air deflection assemblies are used to redirect air emitted by computers in a rack-based computer system. These air deflection assemblies may be used to redirect air emerging horizontally out of the back sides of computers into a vertically-oriented exhaust plenum. This can eliminate the need for exhaust fans to draw heated air through the exhaust plenums and out of the rack.

21 Claims, 9 Drawing Sheets

RACK-MOUNTED AIR DEFLECTOR

BACKGROUND

As information technology has rapidly progressed, computer network centers such as server farms and server clusters have become increasingly important to our society. The server farms provide efficient data processing, storage, and distribution capability that supports a worldwide information infrastructure, which has come to dominate how we live and how we conduct our day to day business. A server farm is a group or cluster of computers acting as servers and housed together in a single location.

Typically, at a site where numerous computers are connected to a network, the computers are stacked in racks and arranged in repeating rows or cells. Access to the computers may be needed for servicing, upgrading hardware, loading software, attaching cables, switching power on and off, and so forth. The elimination of as much access space as is feasible can increase the density of computer systems that may be provided for a given square footage of area at a site.

A standard rack that is widely used measures roughly 19 inches wide, 30 inches deep and 74 inches high. These racks may be arranged in rows of, for example, roughly 10-30 units, with access doors on each side of the racks. Access aisles are provided on both sides of the rows so that an operator may approach the access doors on each side. Many of the racks are filled with cumbersome computers mounted on sliders which are attached through mounting holes provided in the front and back of the rack.

In conventional rack-based computer systems, a plurality of computers are supported in a single stack in a rack. The rack may comprise a rack assembly having a front door and a back door. Each of the computers typically comprises a computer chassis having a main board and other components, such as one or more power supplies, hard drives, processors, expansion cards, contained within the chassis. The front door of the rack assembly provides access to the front sides of the computers and the back door provides access to the back sides, where the I/O ports for the computers are typically provided. Each computer may also include one or more fans that draw ambient air into vents provided on one side of the computer, through the computer chassis, and out of vents provided on the opposite side of the computer. The ambient air passing through the computers is used to cool the various components contained within the computer chassis.

As the number of computers in a server farm is increased, two competing factors come into play: consumption of floor space and heat management. As one increases the density of computers, problems associated with heat dissipation rises dramatically. One of the major causes of electronic component failure is overheating. High performance electronics such as CPUs generate substantial amounts of heat. Hard drives and power supplies emit substantial amounts of heat as well, thereby placing further demands on effective heat dissipation. In order for computers to continue to operate properly, appropriate heat dissipation pathways should be provided. Because each computer contains thousands of heat producing electronic parts, as the density of the computers is increased, one must also address the difficult issues of providing proper cooling mechanisms to remove heat from the individual computer nodes and the clusters as a whole. Therefore, it is desirable to provide an improved cooling system for rack-based computer systems.

SUMMARY

In accordance with the present invention, one or more air deflection assemblies are used to redirect air emitted by computers in a rack-based computer system. These air deflection assemblies may be used to redirect air emerging horizontally out of the back sides of computers into a vertically-oriented exhaust plenum. This can eliminate the need for exhaust fans to draw heated air through the exhaust plenums and out of the rack.

In accordance with embodiments of the present invention, a rack system for housing a plurality of computers is provided, comprising: a rack assembly configured to support a plurality of computers in at least one stack; and at least one air deflection assembly mounted to the rack assembly for redirecting an airflow emerging from computers housed in the rack system.

In accordance with other embodiments of the present invention, a computer system is provided, comprising: a rack assembly; a first plurality of computers supported by the rack assembly in a first stack; and at least one air deflection assembly mounted to the rack assembly adjacent to the first stack of computers for redirecting an airflow emerging from the computers.

In accordance with other embodiments of the present invention, a method is provided for operating a plurality of computers positioned in a stack in a rack assembly having a vertical axis, each of the computers comprising a main board, a computer fan, a front portion, and a back portion, the method comprising: operating each of the computers to generate heat; operating the fan in each of the computers to draw cooling air into the front portion of the computer and to emit exhaust air from the back portion of the computer; and redirecting the exhaust air emitted from the back portion of the computers using one or more air deflection assemblies mounted to the rack assembly.

Other features and aspects of the invention will become apparent from the following detailed description, taken in conjunction with the accompanying drawings which illustrate, by way of example, the features in accordance with embodiments of the invention. The summary is not intended to limit the scope of the invention, which is defined solely by the claims attached hereto.

DETAILED DESCRIPTION

In the following description, reference is made to the accompanying drawings which illustrate several embodiments of the present invention. It is understood that other embodiments may be utilized and mechanical, compositional, structural, electrical, and operational changes may be made without departing from the spirit and scope of the present disclosure. The following detailed description is not to be taken in a limiting sense, and the scope of the embodiments of the present invention is defined only by the claims of the issued patent.

Figure 1:
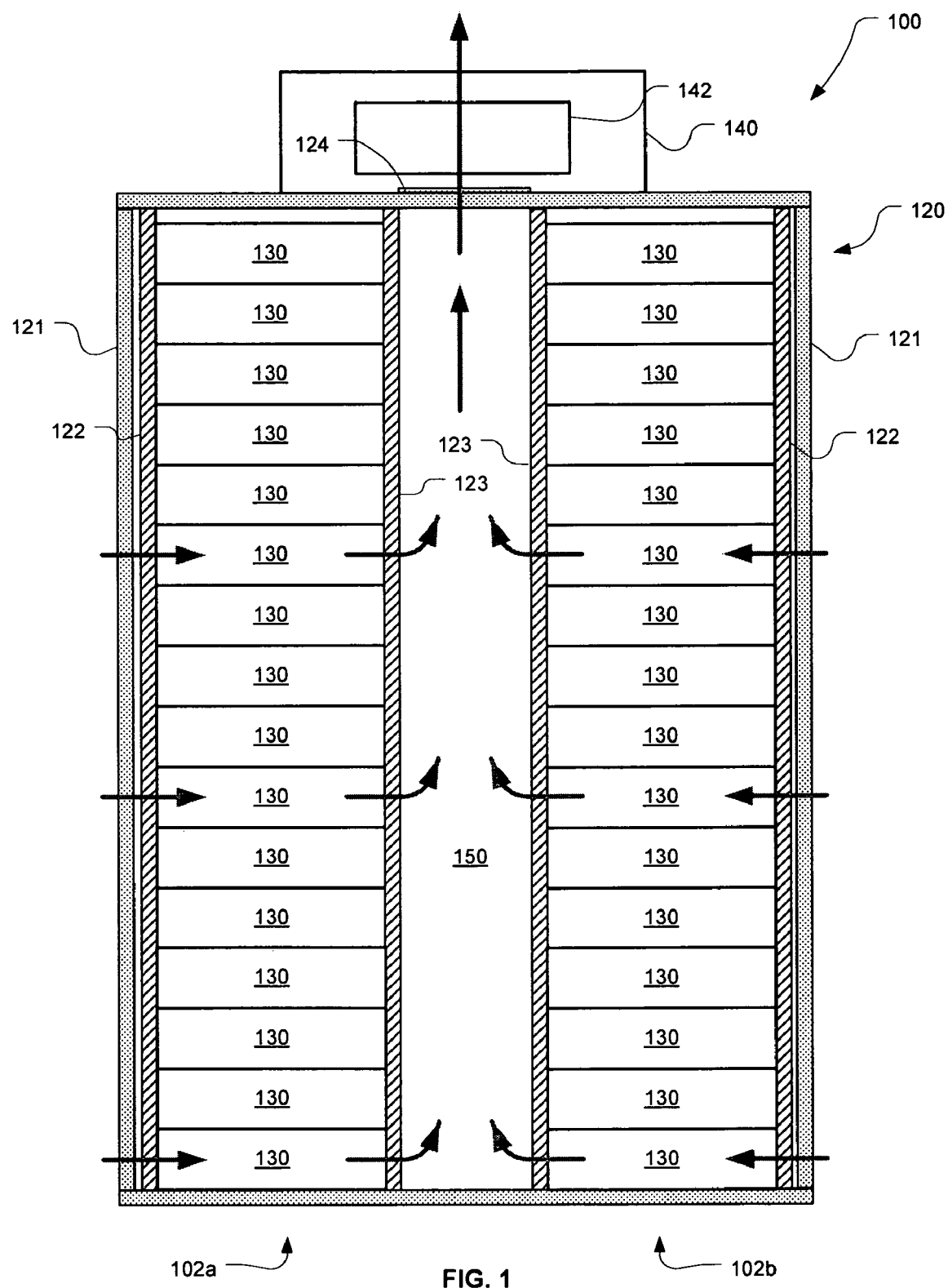
FIG. 1 shows a simplified block diagram of a rack-based computer system having a plurality of computers positioned in a back-to-back arrangement.

FIG. 1 shows a simplified cross-sectional side view of a rack-based computer system 100 having a plurality of computers 130 supported therein. The computer system 100 includes a rack assembly 120, which comprises a frame 121 and a plurality of vertical support members 122-123. Each of the computers 130 are attached to and supported by the vertical supports 122-123 using thumbscrews or pins or the like. The rack assembly 120 also typically includes a plurality of side panels and doors (not shown) which are mounted to the frame 121 to provide a more complete enclosure for the computers 130.

Each of the computers 130 may have a front side and an opposing back side, a top and an opposing bottom, and two opposing lateral sides. As can be seen in FIG. 1, the computers 130 are supported in two stacks 102a, 102b in a back-to-back arrangement such that the back sides of the computers 130 face inward to form a central exhaust plenum 150. This arrangement can allow a user to access the front sides of the computers 130 in both stacks 102a-102b without removing the computers 130 from the rack structure 120.

The two stacks 102a-102b of computers 130 and the rack assembly 120 cooperate to form the central exhaust plenum 150. The rack assembly 120 may comprise, for example, a standard-sized rack, or may have different dimensions. In one embodiment, the rack assembly 120 measures approximately 24" wide, 40" deep, and 74" high. A similar arrangement of computers 130 is described in U.S. Pat. No. 6,496,366, incorporated by reference herein in its entirety.

A computer 130 may comprise any electronic system designed to perform computations and/or data processing. In some embodiments, the computer is an electronic device having a central processing unit (CPU) and memory. The CPU and memory may be provided on a printed circuit board (PCB) main board. The PCB main board may be mounted onto a chassis structure, such as, for example, a sheet of metal or a supporting frame. Multiple computer components, such as, e.g., hard drives, power supplies, processors, memory modules, cables, etc., may be mounted on or coupled to the main board of the computer. Some computers include a generally rectangular housing having vents provided on two or more sides, which allow cooling air to be passed through the housing to cool the various components contained inside the housing. The housing may also include flanges or other mechanical structures which facilitate the mounting of the computer in a rack assembly. Alternatively, the computer may comprise a printed circuit board (PCB) having exposed components without an enclosure.

In some embodiments, the computers 130 in the rack assembly 120 comprise server-class computers. A server is a computer on a network that manages network resources. The server may be dedicated to a particular purpose and may store data and/or perform various functions for that purpose. In other embodiments, the computers 130 may comprise storage arrays.

As shown in FIG. 1, the cooling air plenum 150 is coupled to a vent hood 140. One or more fans 142 are provided within the vent hood 140 in order to draw the exhaust air coming from the computers 130 up through the central exhaust plenum 150 and out of an exhaust port for the rack assembly 120. In one system 100, six 550 CFM fans 142 are used to move the desired amount of air out of the rack assembly 120 in order to maintain the computers 130 at the desired operating temperature. These fans 142 produce an upward airflow within the central exhaust plenum 150, resulting in a cooling airflow path that generally follows the direction shown by the arrows in FIG. 1. However, in practice, the airflow through the rack assembly 120 is not laminar and a considerable amount of turbulence exists within the plenum 150. Each of the computers 130 include internal fans which blow air out of the backs of the computers 130 into the plenum 150. Because of the back-to-back arrangement of the stacks 102a-102b of computers 130, the air being blown out of the backs of the computers 130 in the first stack 102a collides with the air being blown out of the backs of the computers 130 in the second stack 102b, resulting in an increased air pressure and turbulence within the plenum 150. Although the fans 142 draw much of the exhaust air upwards out of the rack assembly 120, a significant amount of the heated exhaust air leaks out of the sides and bottom of the rack assembly 150, thereby heating the air being drawn in as cooling air for adjacent computer systems.

In addition to the airflow problems described above, the fans 142 in the vent hood 140 pose power and cost issues as well. The high-capacity fans 142 and vent hood 140 add to the overall cost of the computer system 100. The fans 142 also consume a significant amount of power, thereby increasing the overall power consumption by the computer system 100 and, as a result, increasing the cost of operation. In some cases, the fans may be configured to operate on AC power, while the computers 130 mounted in the rack assembly 120 are configured for DC power. If a single type of power is provided to the computer system 100, then an inverter must be used in order to provide both AC and DC power to the various components. Alternatively, the manufacturer must stock both AC and DC fans in order to match the power of the fan with the power of the various components of the system 100.

Figure 2:
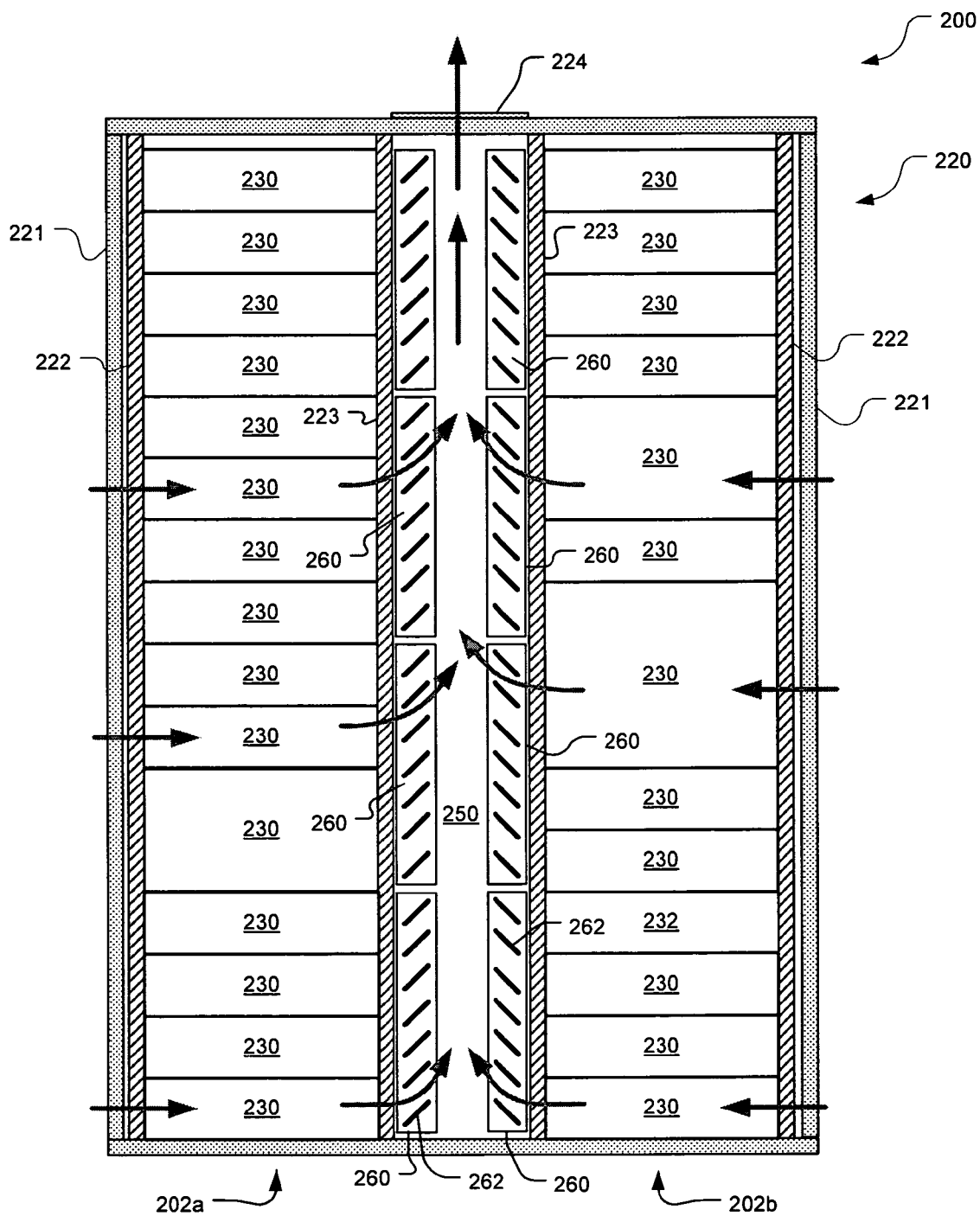
FIG. 2 shows a simplified block diagram of a rack-based computer system with air deflection assemblies, in accordance with embodiments of the present invention.

In accordance with embodiments of the present invention, a rack-mounted air deflector is provided for reducing turbulence within the rack assembly and channeling the air away from the computer system. FIG. 2 shows a simplified block diagram of a computer system 200 comprising a rack assembly 220 containing two stacks 202a-202b of computers 230, similar to the two stacks 102a-102b of computers 130, shown in FIG. 1. The computers 230 in the system 200 may be the same type of computer or may be different. For example, some of the computers 230 may comprise servers, while other computers 230 may comprise storage arrays. The rack assembly 220 may also contain other components, such as switches and power supplies. Each of these components may have different form factors, e.g., 1U, 2U, 3U, or larger, wherein each "U" is approximately 1.75 inches high. In contrast with computer system 100, however, computer system 200 does not use fans to draw air out of the central exhaust plenum 250. The computer system 200 includes a plurality of air deflection assemblies 260 configured to receive the air emitted horizontally from the back sides of the computers 130 and redirect the exhaust air upwards through the cooling air plenum 250 and out of the exhaust port 224.

The rack assembly 220 comprises a frame 221 having a plurality of support members 222-223 for supporting the various computers 230 and other components in the computer system 200. In FIG. 2, each stack 202 is supported by a pair of front support members 222a-222b and a pair of rear support members 223a-223b. These support members 222-223 support the four corners of the computers 230 mounted in the rack assembly 220 and are provided with a plurality of vertical holes to provide flexibility in size and arrangement of the computers 230 in the rack assembly 220.

Figure 3A:
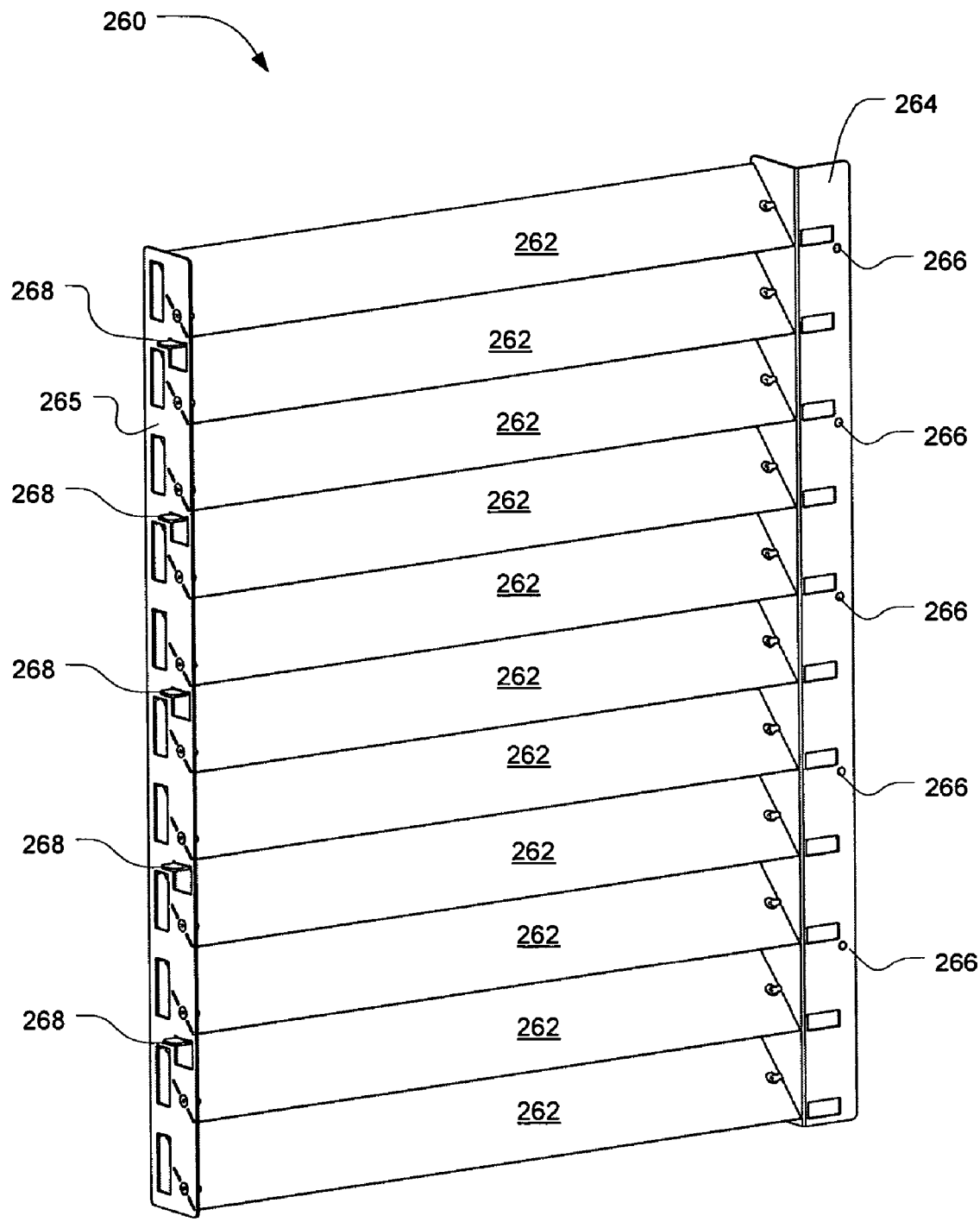
FIGS. 3A-3B are front and back perspective views of an air deflection assembly, in accordance with embodiments of the present invention.
Figure 3B:
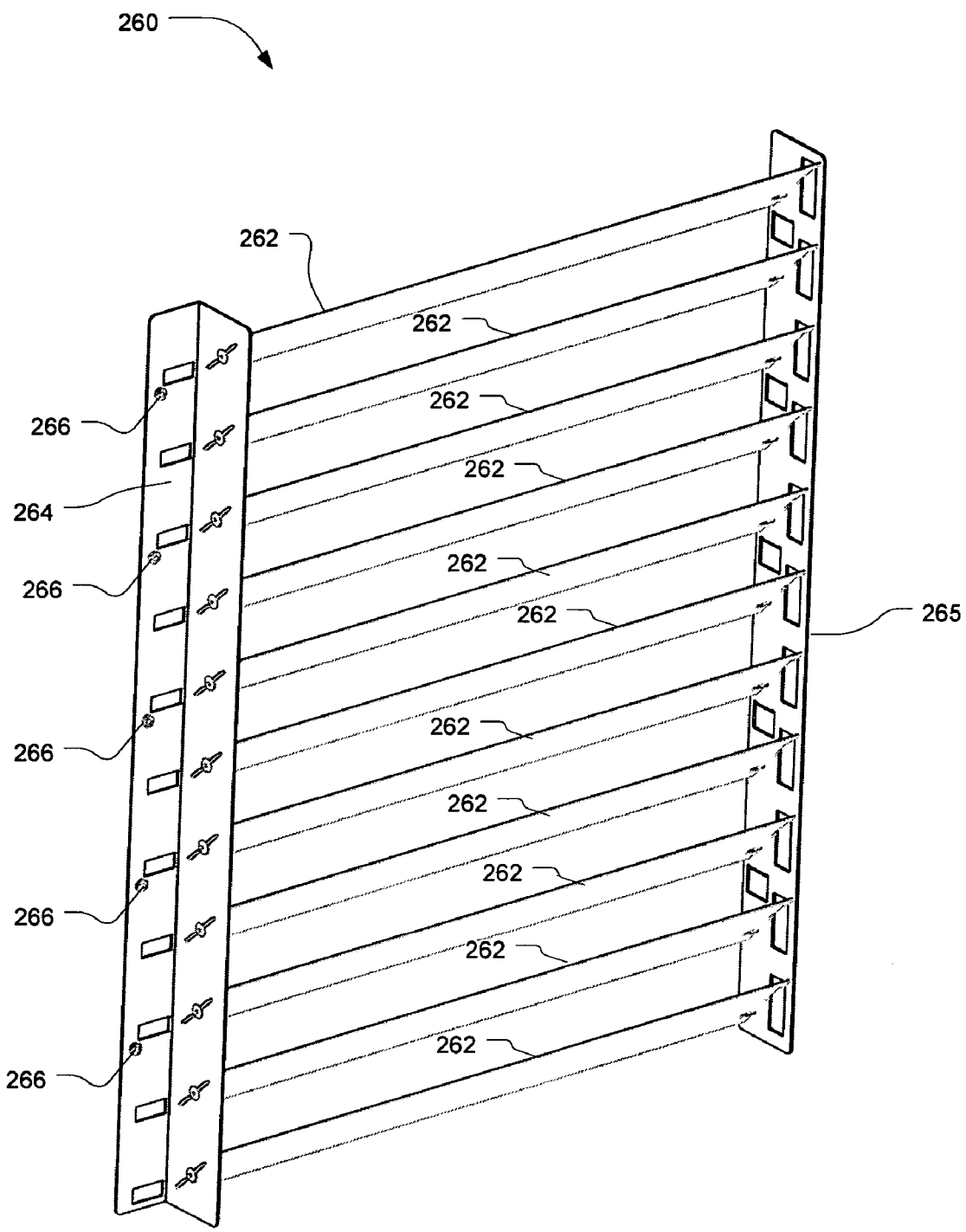

FIGS. 3A-3B show front and rear perspective views of an air deflection assembly 260, in accordance with an embodiment of the present invention. FIG. 3A shows the front side of the air deflection assembly 260 which is positioned adjacent to the back sides of the computers 230. FIG. 3B shows the back side of the air deflection assembly 260 which faces the interior of the exhaust plenum 250. The air deflection assembly 260 comprises a pair of vertical frame members 264-265 which support a plurality of blades 262 positioned at an angle relative to the direction of exhaust air being emitted by the computers 230. In this embodiment, frame member 264 is attached to the rack assembly 220 using bolts passed through bolt holes 266, and frame member 265 is attached to the rack assembly 220 by inserting the flanges 268 into slots provided on the rear support member 223a, as will be described in greater detail below with respect to FIG. 6. The frame members 264-265 and the blades 262 can be made of, e.g., sheet metal using conventional metal fabrication techniques such as bending, forming, and stamping. As a result, the air deflection assembly 260 can be made very inexpensively.

Figure 4:
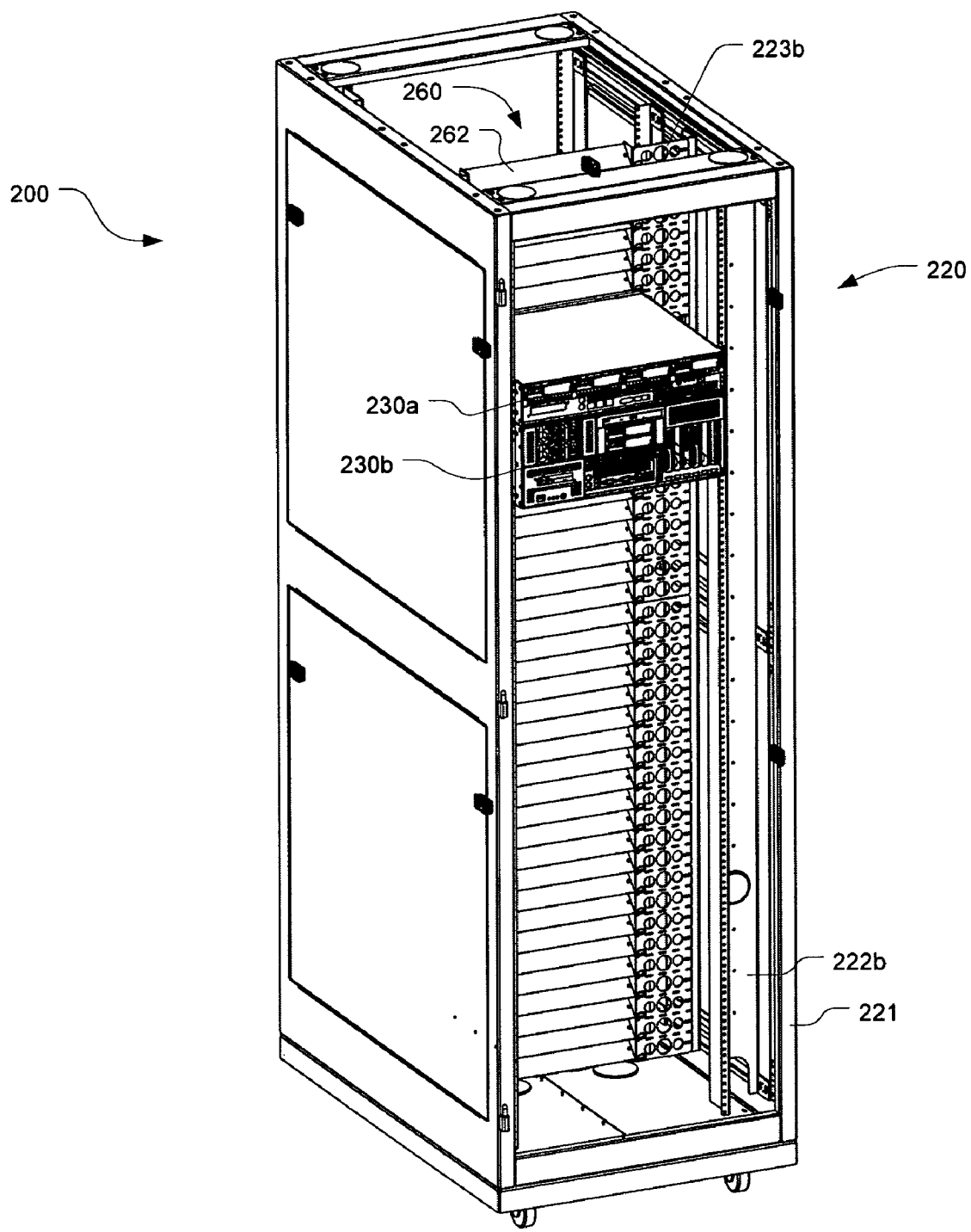
FIG. 4 is a perspective view of a rack-based computer system with air deflection assemblies, in accordance with embodiments of the present invention.
Figure 5:
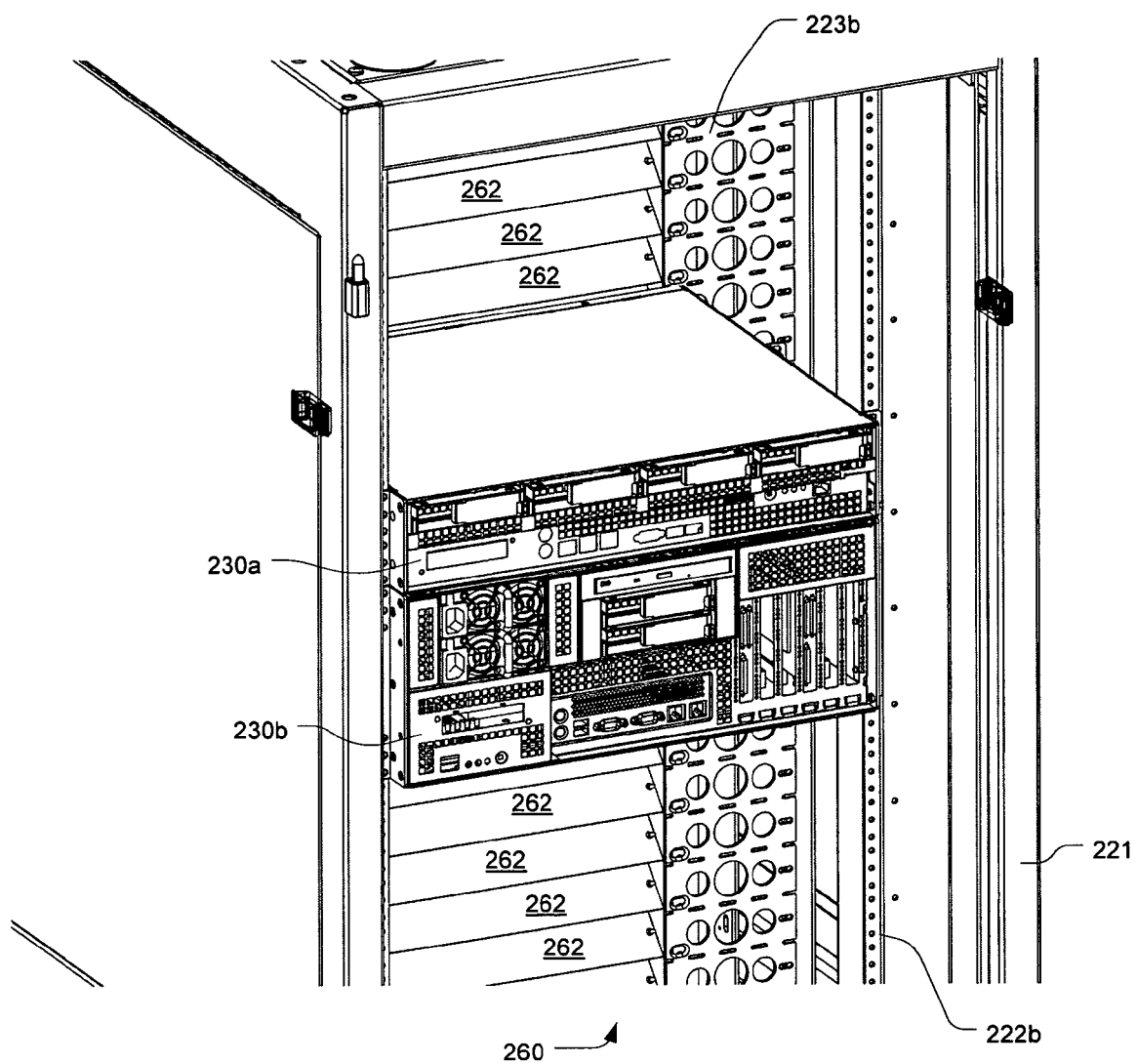
FIG. 5 is an enlarged view of a portion of the computer system shown in FIG. 4.

FIG. 4 shows a perspective view of a computer system 200, in accordance with an embodiment of the present invention. FIG. 5 is an enlarged view of a portion of the computer system 200 shown in FIG. 4. The computer system 200 has dimensions of approximately 84"H×40"D×26"W and includes a rack assembly 220 which is configured to support two stacks 202a-202b, each stack capable of supporting 44U of components (i.e., approximately 77 inches of vertical clearance). As described above, each of these components can have a different form factor. In FIG. 4, only two computers 230a, 230b are shown. Computer 230a has a 2U profile with dimensions of approximately 3.5"H×17.6"W×14.375"D, while computer 230b has a 3U profile with dimensions of approximately 5.25"H×17.6"W×15.5"D. It will be understood that in practice, the rack assembly 220 would typically include a greater number of computers 230, which would partially or completely fill each stack of the rack assembly 220. These computers 230 are omitted from the figures to improve clarity and to expose the air deflection assemblies 260. In systems 200 that are only partially filled with components, there will be gaps 232 in the stacks 202 that may be covered or exposed.

In FIG. 4, each stack 202 is provided with four air deflection assemblies 260, with each air deflection assembly 260 spanning a height of approximately 11U. Thus, four air deflection assemblies 260 are sufficient to span the entire interior height of the rack assembly 220 and to redirect the exhaust air emerging from all of the computers 230 in the stack 202. In other embodiments, the air deflection assemblies 260 may be differently sized and greater or fewer air deflection assemblies 260 may be mounted onto the rack assembly 220 in order to partially or fully cover the entire interior length of the stack 202.

Figure 6:
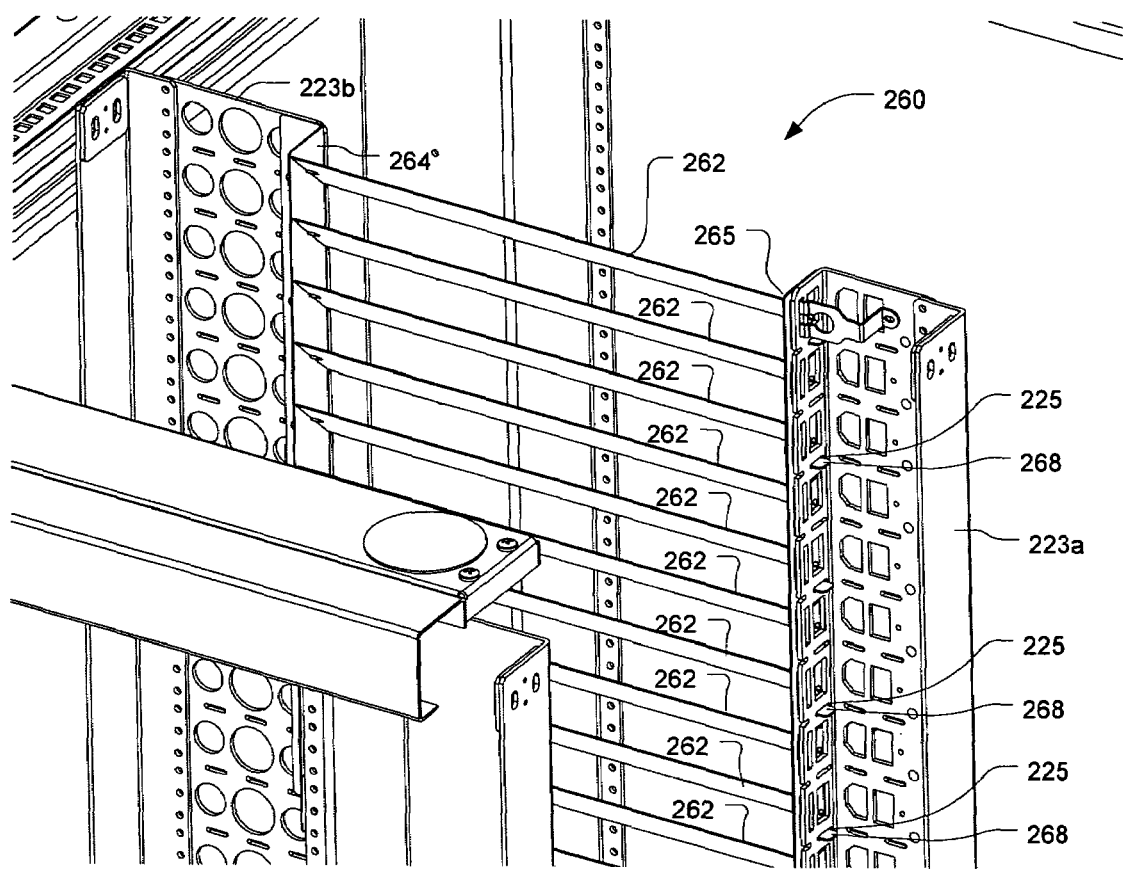
FIG. 6 is a partial view of an exhaust plenum and air deflection assembly, in accordance with embodiments of the present invention.

FIG. 6 is a perspective view of the computer system 200 with various features removed for clarity. FIG. 6 shows the side of the air deflection assembly 260 facing the interior of the central exhaust plenum 250. The air deflection assembly 260 can be mounted onto an existing rack assembly 220 by attaching frame member 264 with rear support member 223b and frame member 265 with rear support member 223a. FIG. 6 shows how the flanges 268 of the air deflection assembly 260 are received in the slots 225 of the rear support member 223a. This design is advantageous in that the air deflection assembly 260 can be mounted onto existing rack assemblies 220, such as the rack assemblies currently available from Rackable Systems, Inc., of Milpitas, Calif.

In the embodiment illustrated in FIGS. 4-6, each of the computers 230 is provided with one or more internal fans that draw cooling air into the front sides of the computers 230 and over the heat-generating components within the computers 230 (such as, e.g., the microprocessors, hard drives, and power supplies). The heated air is then blown out of the back sides of the computers 230 and into the central exhaust plenum 250 by the internal fans. As described above, the air is blown out of the computers 230 in a generally horizontal direction, but passes out of the exhaust port 224 of the rack assembly 220 in a generally vertical direction. Without the use of the air deflection assemblies 260, the transition of the airflow from the horizontal direction to the vertical direction results in a significant amount of turbulence and increased air pressure within the central exhaust plenum 250. In accordance with the present invention, one or more air deflection assemblies 260 are used to redirect the flow of air emerging from the computers 230 into the central exhaust plenum 250.

The blades 262 of the air deflection assemblies 260 are positioned at an angle to the direction of airflow emerging from the computers 230 so that the exhaust airflow can be redirected from the horizontal direction to the vertical direction. By providing the angled blades 262, the turbulence of the fluid flow through the exhaust plenum 250 can be reduced. This is particularly advantageous in systems having computers positioned back-to-back so that without the air deflection assemblies 260, the exhaust air from a first stack 202a of computers 230 blows against the exhaust air from a second stack 202a of computers 230. If each stack 202a-202b of computers 230 is provided with air deflection assemblies 260, then the exhaust air emerging from the back-to-back computers will not be blow directly at the opposing stack of computers. Instead, the exhaust air will be redirected to an angle more closer to vertical. It has been determined that in some embodiments, the redirection of the exhaust flow by the air deflection assemblies is sufficient to eliminate the need for exhaust vans provided in a vent hood. When the airflow generated by the internal fans of the computers is redirected by the air deflection assemblies, the airflow maintains a sufficient force as the air travels through the exhaust plenum that no additional air movers are required to ensure that exhaust air is evacuated from the rack assembly. In back-to-back systems lacking air deflection assemblies, much of the pressure generated by the internal computer fans causes the exhaust air to flow in many directions. In contrast, the air deflection assemblies more efficiently utilize the air moving capabilities of the internal computer fans to drive the exhaust air out of the rack assembly.

In accordance with embodiments of the present invention, the air deflection assemblies 260 comprise separate components that are attached to the vertical support members 223 of the rack assembly 220. Because the air deflection assemblies 260 are attached to the rack assembly 220 and not the individual computers 230, the air deflection assemblies 260 can be attached without regard to the type, size, and arrangement of computers in the rack assembly 220. Thus, differently sized computers and other components may be mounted in the rack assembly 220 after the air deflection assemblies 260 are attached. In addition, a manufacturer does not need to stock a variety of differently sized air deflection assemblies 260 for each type of component being mounted in the system. Because the air deflection assemblies 260 may be manufactured using simple sheet metal and metalworking techniques, the cost can be kept low. Therefore, the rack assembly 220 can be provided with a complete set of air deflection assemblies 260 lining the interior of the exhaust plenum 250, without regard to the number of computers 230 to be mounted in the rack assembly 220.

The air deflection assemblies may also be sized so that each air deflection assembly extends across a plurality of computers, and will therefore redirect the air emitted by a plurality of computers. This can reduce assembly time by requiring the installation of only a single air deflection assembly for a plurality of computers.

By the eliminating the need for exhaust fans in the vent hood, the power demands can be reduced. In addition, it is no longer necessary to provide a separate inverter to provide the necessary type of power to the fans. Another advantage is that the overall height of the computer system can be reduced. In some installations, the ceiling height may be limited, so the elimination of the vent hood can allow a taller rack assembly to be used, and, as a result, a larger number of computers may be provided in each stack.

Figure 7:
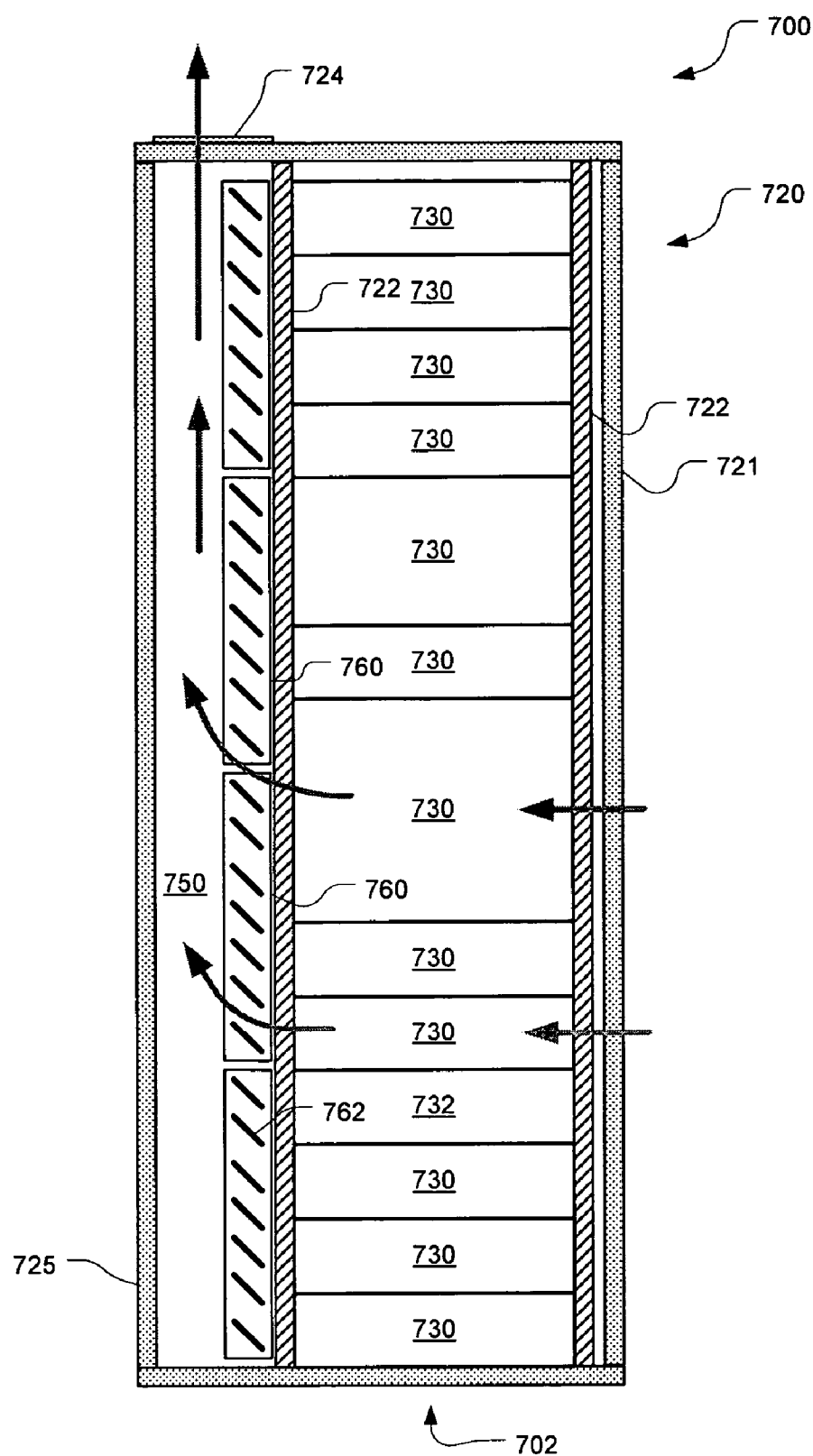
FIG. 7 is a simplified block diagram of a rack-based computer system having a single stack of computers and air deflection assemblies, in accordance with embodiments of the present invention.

FIG. 7 shows an embodiment in which air deflection assemblies 260 are used in a computer system 700 having a single stack 702 of computers 730. The rack assembly 720 is similar to the rack assembly 220 in FIG. 2, but the computers are not positioned in a back-to-back arrangement, so only a single stack 702 is used. In this embodiment, the exhaust air emitted from the computers 730 is redirected by the blades 762 of the air deflection assemblies 760 as the exhaust air enters the exhaust plenum 750. These air deflection assemblies 760 can be similar or identical to the air deflection assemblies 260 described above. The use of the air deflection assemblies 760 reduces the amount of turbulence that would result if the exhaust air were allowed to blow straight back into back wall 725 of the rack assembly 720 and eliminates the need for fans in a vent hood in order to draw the exhaust air upwards out of the exhaust plenum 750.

Figure 8:
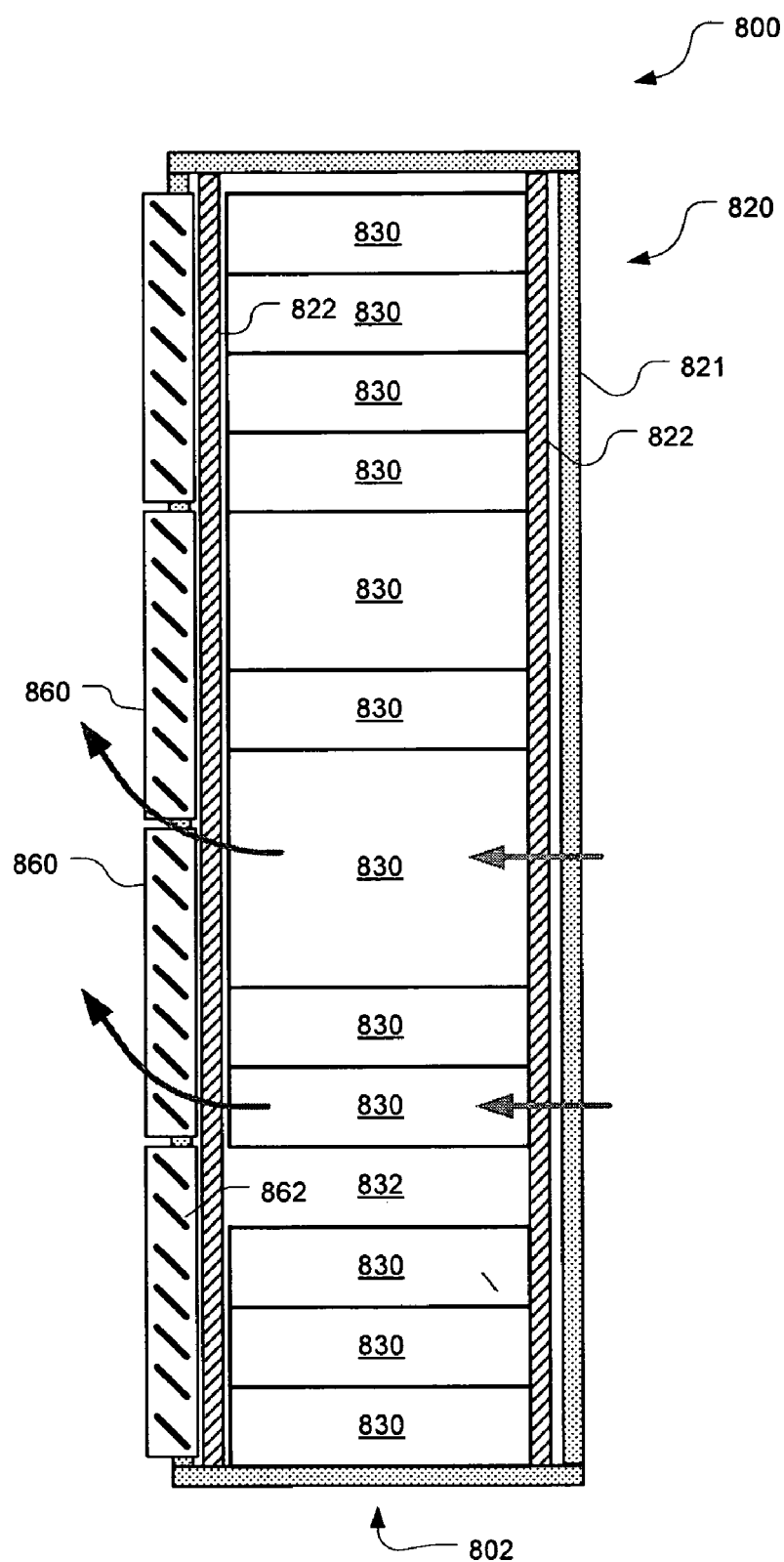
FIG. 8 is a simplified block diagram of another rack-based computer system having a single stack of computers and air deflection assemblies, in accordance with embodiments of the present invention.

FIG. 8 shows an embodiment in which air deflection assemblies 260 are used in a computer system 800 having a single stack 802 of computers 830 and no exhaust plenum. The rack assembly 820 can be the any of a variety of rack assemblies commercially available for rack-based computer systems. In conventional operation, the internal fans in each computer would draw cooling air through vents provided on the front sides of the computers 830, over the heat-generating components contained within the computers 830, and blow the heated exhaust air out of the back sides of the computers 830. Because no enclosed exhaust plenum is used, the problem of turbulence is typically not encountered. However, these rack-based computer systems are often located in server rooms containing large numbers of rack-based computer systems. Accordingly, the heated exhaust air emitted from the back sides of the computers 830 blows toward other rack assemblies in the room. This can reduce the efficiency of the cooling systems and can place large demands on the HVAC system for the server room. By using air deflection assemblies 860 (similar or identical to the air deflection assemblies 260 described above), the exhaust air emitted from the computers 830 can be redirected upwards away from the neighboring computer systems. This can help to reduce the temperature of the cooling air being drawn into neighboring computers. In addition, the heated exhaust air blown upwards towards return air vents in the ceiling can be more easily vented from the server room by the HVAC system.

In some embodiments, such as the back-to-back systems described above, the computers mounted in the rack assemblies may have substantially all of the I/O ports provided on the front sides of the computers. For instance, all I/O ports and other interfaces that are accessed while the computer is in operation can be provided on the front sides of the computers. Thus, the back-to-back arrangement of computers does not impair the operator's access to necessary components. In this case, the back sides of the computers are rarely or never accessed, so the air deflection assemblies can be fixedly mounted using screw, nuts, or other difficult to remove fasteners.

In other embodiments, such as the single stack systems described above with respect to FIGS. 7-8, an operator may need to frequently access the back sides of the computers mounted in the rack assembly in order to plug in I/O cables or replace hot swap devices. In this case, it may be desirable for the air deflection assemblies to be more easily removed in order to provide access to the back sides of the computers. This can be done, for example, by mounting the air deflection assemblies on hinges, which allow the blades of the air deflection assemblies to be swung away to expose the computers, like a shutter on a window. In yet other embodiments, the air deflection assemblies may be attached to the rack assembly in an easily and rapidly removable fashion, such as, e.g., by using simple mounting flanges, hook and loop fasteners, or quick release clips.

While the invention has been described in terms of particular embodiments and illustrative figures, those of ordinary skill in the art will recognize that the invention is not limited to the embodiments or figures described. For example, in some embodiments, the computers are oriented in the rack assembly such that the main boards in the computers are approximately parallel to the floor of the server room and approximately perpendicular to the general flow of air through the exhaust plenum. In other embodiments, the computers may be oriented differently. For example, the computers may be positioned so that the main boards are perpendicular to the floor. The air deflection assemblies may still be used to redirect the flow of exhaust air emitted by the computers in order to provide a more laminar flow through the exhaust plenum and out of the rack assembly. Because heated air tends to rise above cooler air, it is generally desirable to arrange the blades of the air deflection assembly plenum so that the heated exhaust air flows upwards through the exhaust plenum and out of the rack assembly. However, in some embodiments, due to design or facility constraints, it may be desirable to have the exhaust air be redirected by the air deflection assemblies in other directions, such as sideways or downwards. The embodiments described herein show the exhaust port being positioned at the top of the rack assembly. In other embodiments, the exhaust port may be positioned elsewhere in the system. For example, in some embodiments, the exhaust port may be positioned at the bottom of the cooling air plenum to draw the air from the back sides of the computers down to the bottom of the rack assembly. Ductwork may be provided under the floor supporting the computer system in order to channel the exhaust air away. In yet other embodiments, exhaust ports may be provided at both the top and the bottom of the cooling air plenum to draw air in both directions, or may be provided at one or more lateral sides of the rack.

Many of the embodiments described above refer to the computer systems being utilized as part of a server farm. In other embodiments, the computer systems may be used for other purposes, such as, for example, storage arrays. The multiple computers in a single stack may be identical or may be different. In some embodiments, the computers in a stack may have different form factors (e.g., some computers have a 1U profile, while others have a 2U or 3U profile) and may be configured to perform different tasks (e.g., one or more computers may be configured as a central controllers, while other computers in the stack may be configured as storage arrays).

In addition, while some of the embodiments described above refer to computer systems fully or partially populated with computers, it is to be understood that in other embodiments, different types of components may be mounted in one or more of the available shelf locations in the rack assembly. For example, one or more of the locations may be consumed by dedicated power supplies, routers, switches, keyboards, or other electronic components. These components may or may not be configured to utilize a flow of cooling air during operation.

In the embodiments described above, the air deflection assemblies are separate components mounted onto the support members. This arrangement may be desirable so that existing rack assemblies designed for use with a vent hood and exhaust fans may be retrofitted with air deflection assemblies. In the illustrated embodiments, multiple air deflection assemblies are provided for redirecting the air from each stack or column of computers. In other embodiments, a single large air deflection assembly may be used. In some embodiments, the air deflection assembly may be integrated into the rack assembly and may form an inseparable portion of the rack assembly.

The figures provided are merely representational and may not be drawn to scale. Certain proportions thereof may be exaggerated, while others may be minimized. The figures are intended to illustrate various implementations of the invention that can be understood and appropriately carried out by those of ordinary skill in the art.

Therefore, it should be understood that the invention can be practiced with modification and alteration within the spirit and scope of the appended claims. The description is not intended to be exhaustive or to limit the invention to the precise form disclosed. It should be understood that the invention can be practiced with modification and alteration and that the invention be limited only by the claims and the equivalents thereof.

What is claimed is:

1. A rack system for housing a plurality of computers, comprising:
   a rack assembly configured to support a plurality of computers in at least one stack; and
   at least one air deflection assembly mounted to the rack assembly, each air deflection assembly comprising a plurality of blades for redirecting an airflow emerging from computers housed in the rack system.

2. The rack system of claim 1, wherein each air deflection assembly at least partially overlaps with two or more of the plurality of computers so as to redirect air from the two or more computers.

3. The rack system of claim 1, wherein:
   each air deflection assembly comprises two vertical frame members and the plurality of blades are supported between the two vertical frame members, wherein the two vertical frame members are coupled to the rack assembly and the plurality of blades are positioned at an angle to a direction of exhaust air emitted from the computers.

4. The rack system of claim 1, further comprising:
   an exhaust plenum laterally adjacent to the stack of computers for receiving the horizontal airflow emerging from the computers and directing the vertical airflow out of an exhaust port of the rack system.

5. The rack system of claim 4, wherein:
   the rack assembly is configured to support the plurality of computers in two stacks such that the back sides of computers in the first stack face the back sides of the computers in the second stack and the exhaust plenum is disposed between the back sides of computers in the first stack and the back sides of the computers in the second stack.

6. The rack system of claim 1, wherein:
   the plurality of blades redirect a horizontal airflow emerging from computers housed in the rack system in a vertical direction.

7. A computer system, comprising:
   a rack assembly;
   a first plurality of computers supported by the rack assembly in a first stack; and
   at least one air deflection assembly mounted to the rack assembly adjacent to the first stack of computers, each air deflection assembly comprising a plurality of blades for redirecting an airflow emerging from the computers.

8. The computer system of claim 7, wherein each air deflection assembly at least partially overlaps with two or more of the plurality of computers so as to redirect air from the two or more computers.

9. The computer system of claim 7, wherein:
   each of the first plurality of computers comprises an internal fan for drawing air into a front side of the computer and emitting air out of the back side of the computer; and
   each air deflection assembly receives the air emitted out of the back sides of the computers and redirects the air into a different direction.

10. The computer system of claim 9, further comprising:
    a vertical exhaust plenum laterally adjacent to the first plurality of computers for receiving the air emitted from the computers and directing the airflow out of an exhaust port on a top side of the rack assembly;
    wherein each computer emits air out of the back side of the computer in a horizontal exhaust direction and each air deflection assembly redirects the emitted air towards the exhaust port.

11. The computer system of claim 7, wherein:
    each air deflection assembly comprises two vertical frame members and the plurality of blades supported between the two vertical frame members, wherein the two vertical frame members are coupled to the rack assembly and the plurality of blades are positioned at an angle to a direction of exhaust air emitted from the computers.

12. The computer system of claim 7, further comprising:
an exhaust plenum for receiving the airflow emerging from the computers and directing the airflow out of an exhaust port of the rack assembly.

13. The computer system of claim 12, wherein:
the rack assembly is configured to support the plurality of computers in two stacks such that the back sides of computers in the first stack face the back sides of the computers in the second stack and the exhaust plenum is disposed between the back sides of computers in the first stack and the back sides of the computers in the second stack.

14. The computer system of claim 7, wherein:
each of the first plurality of computers discharges air in a lateral direction; and
each air deflection assembly is mounted to the rack assembly laterally adjacent to the first stack of computers and redirects the airflow emerging from the computers in a vertical direction.

15. A method of operating a plurality of computers positioned in a stack in a rack assembly having a vertical axis, each of the computers comprising a main board, a computer fan, a front portion, and a back portion, the method comprising:
operating each of the computers to generate heat;
operating the fan in each of the computers to draw cooling air into the front portion of the computer and to emit exhaust air from the back portion of the computer; and
redirecting the exhaust air emitted from the back portion of the computers using one or more air deflection assemblies mounted to the rack assembly, each air deflection assembly comprising a plurality of blades.

16. The method of claim 15, wherein:
said redirecting comprises positioning the blades at an angle to the direction of airflow emitted from the back portions of the computers.

17. The method of claim 16, wherein:
said redirecting comprises positioning the blades at an angle to the direction of airflow emitted from the back portions of the computers to redirect the airflow upwards.

18. The method of claim 17, wherein:
said redirecting comprises positioning the blades at an angle to the direction of airflow emitted from the back portions of the computers to redirect the airflow upwards though an exhaust plenum.

19. The method of claim 15, wherein:
the rack assembly supports two stacks of computers with an exhaust plenum positioned between the two stacks; and
said redirecting comprises positioning blades at an angle to the direction of airflow emitted from the back portions of the computers in both stacks.

20. The method of claim 15, further comprising:
channeling the exhaust air from the computers through an exhaust plenum up and out of the rack assembly.

21. The method of claim 15, wherein:
the back portions of the computers are substantially aligned along a back plane of the stack and the one or more air deflection assemblies are mounted to the rack assembly adjacent to the back plane of the stack.

* * * * *